United States Patent
Munnelly et al.

(10) Patent No.: US 7,659,046 B2
(45) Date of Patent: Feb. 9, 2010

(54) WATER-DEVELOPABLE INFRARED-SENSITIVE PRINTING PLATE

(75) Inventors: Heidi M. Munnelly, Windsor, CO (US); Kevin Wieland, Greeley, CO (US); Kevin Barry Ray, Fort Collins, CO (US)

(73) Assignee: Eastman Kodak Company, Rochester, NY (US)

( * ) Notice: Subject to any disclaimer, the term of this patent is extended or adjusted under 35 U.S.C. 154(b) by 785 days.

(21) Appl. No.: 11/013,954

(22) Filed: Dec. 16, 2004

(65) Prior Publication Data
US 2005/0123853 A1   Jun. 9, 2005

Related U.S. Application Data

(63) Continuation-in-part of application No. 10/891,727, filed on Jul. 15, 2004, now Pat. No. 7,172,850, and a continuation-in-part of application No. 10/872,209, filed on Jun. 17, 2004, and a continuation-in-part of application No. 10/119,454, filed on Apr. 10, 2002, now Pat. No. 6,899,994.

(51) Int. Cl.
  *G03C 1/00*    (2006.01)
  *G03F 7/26*    (2006.01)
(52) U.S. Cl. .................................. 430/270.1; 430/302
(58) Field of Classification Search .............. 430/281.1, 430/270.1, 302
See application file for complete search history.

(56) References Cited

U.S. PATENT DOCUMENTS

| | | | |
|---|---|---|---|
| 4,123,276 A * | 10/1978 | Kita et al. ................... | 430/176 |
| 4,565,769 A | 1/1986 | Dueber et al. | |
| 4,973,572 A | 11/1990 | DeBoer | |
| 4,997,745 A | 3/1991 | Kawamura et al. | |
| 5,075,192 A | 12/1991 | Fryd et al. | |
| 5,107,063 A | 4/1992 | West et al. | |
| 5,208,135 A | 5/1993 | Patel et al. | |
| 5,242,779 A | 9/1993 | Mueller-Hess et al. | |
| 5,330,884 A | 7/1994 | Fabricius | |
| 5,368,990 A | 11/1994 | Kawabata et al. | |
| 5,496,903 A | 3/1996 | Watanabe et al. | |
| 5,599,650 A | 2/1997 | Bi et al. | |
| 5,609,980 A | 3/1997 | Matthews et al. | |
| 5,616,449 A | 4/1997 | Cheng et al. | |
| 5,624,777 A * | 4/1997 | Kato et al. ................... | 430/96 |
| 5,731,129 A * | 3/1998 | Koshimura et al. ........ | 430/286.1 |
| 5,811,220 A | 9/1998 | Cheng et al. | |
| 5,858,617 A * | 1/1999 | Nakayama et al. ........ | 430/281.1 |
| 5,928,833 A | 7/1999 | Matthews et al. | |
| 5,942,372 A | 8/1999 | West et al. | |
| 5,965,324 A * | 10/1999 | Okubo et al. ............ | 430/281.1 |
| 5,972,838 A | 10/1999 | Pearce et al. | |
| 6,010,824 A * | 1/2000 | Komano et al. .......... | 430/281.1 |
| 6,017,673 A | 1/2000 | Vanmaele et al. | |
| 6,071,675 A * | 6/2000 | Teng .......................... | 430/302 |
| 6,187,502 B1 | 2/2001 | Chapman et al. | |
| 6,203,603 B1 * | 3/2001 | Takayama et al. ......... | 106/31.16 |
| 6,242,156 B1 * | 6/2001 | Teng ...................... | 430/270.1 |
| 6,245,483 B1 | 6/2001 | Oshimo et al. | |
| 6,294,311 B1 | 9/2001 | Shimazu et al. | |
| 6,309,792 B1 | 10/2001 | Hauck et al. | |
| 6,326,122 B1 | 12/2001 | Nagasaka et al. | |
| 6,358,660 B1 * | 3/2002 | Agler et al. ................. | 430/126 |
| 6,489,078 B1 | 12/2002 | Damme et al. | |
| 6,548,222 B2 * | 4/2003 | Teng ...................... | 430/278.1 |
| 6,550,387 B1 | 4/2003 | Vermeersch et al. | |
| 6,566,029 B2 | 5/2003 | Kawamura et al. | |
| 6,582,882 B2 * | 6/2003 | Pappas et al. ............. | 430/271.1 |
| 6,641,976 B2 | 11/2003 | Vermeersch et al. | |
| 6,653,042 B1 | 11/2003 | Fukino et al. | |
| 2001/0021750 A1 | 9/2001 | Utsunomiya et al. | |
| 2002/0197564 A1 | 12/2002 | Timpe et al. | |
| 2003/0064318 A1 | 4/2003 | Huang et al. | |
| 2003/0073033 A1 | 4/2003 | Kawamura et al. | |
| 2003/0075066 A1 | 4/2003 | Tan et al. | |
| 2003/0129520 A1 | 7/2003 | Oohashi et al. | |
| 2003/0157433 A1 | 8/2003 | Timpe et al. | |
| 2004/0013968 A1 | 1/2004 | Teng | |
| 2004/0091811 A1 | 5/2004 | Munnelly et al. | |
| 2004/0259027 A1 | 12/2004 | Munnelly et al. | |

FOREIGN PATENT DOCUMENTS

| | | |
|---|---|---|
| EP | 0 514 145 A1 | 11/1992 |
| EP | 1 117 005 A1 | 7/2001 |
| EP | 0 823 327 B1 | 11/2004 |

OTHER PUBLICATIONS

U.S. Appl. No. 10/842,111, filed May 10, 2004, Tao et al.
"Glossary of Basic Terms in Polymer Science", published by International Union of Pure and Applied Chemistry (IUPAC), *Pure Appl. Chem.* 68, 2287-2311 (1996).

* cited by examiner

*Primary Examiner*—Cynthia H Kelly
*Assistant Examiner*—Connie P Johnson
(74) *Attorney, Agent, or Firm*—J. Lanny Tucker

(57) ABSTRACT

The present invention provides an imageable element including a lithographic substrate and an imageable layer disposed on the substrate. The imageable layer includes a radically polymerizable component, an initiator system capable of generating radicals sufficient to initiate a polymerization reaction upon exposure to imaging radiation, and a polymeric binder having a hydrophobic backbone and including constitutional units having a pendant group including a hydrophilic poly(alkylene oxide) segment. The imageable element can be developed using an aqueous developer solution. Alternatively, the imageable element can be developed on-press by contact with ink and/or fountain solution.

20 Claims, No Drawings

WATER-DEVELOPABLE INFRARED-SENSITIVE PRINTING PLATE

REFERENCE TO RELATED APPLICATION

This application is a continuation-in-part of U.S. patent application Ser. No. 10/891,727 filed Jul. 15, 2004, and entitled "Preparation of Solvent-Resistant Binder for an Imageable Element," the disclosure of which is incorporated herein by reference in its entirety. This application is a continuation-in-part of U.S. patent application Ser. No. 10/872, 209 filed Jun. 17, 2004, and entitled "Imageable Element with Solvent-Resistant Polymeric Binder," the disclosure of which is incorporated herein by reference in its entirety. This application is a continuation-in-part of U.S. patent application Ser. No. 10/119,454 filed Apr. 10, 2002, the disclosure of which is incorporated herein by reference in its entirety.

TECHNICAL FIELD

The present invention relates to imageable elements useful as lithographic printing plate precursors. In conventional or "wet" lithographic printing, ink-receptive regions, known as image areas, are generated on a hydrophilic surface of a lithographic substrate to produce a printing plate. When the surface of the printing plate is moistened with water and ink is applied, the hydrophilic regions retain water and repel ink, and the ink-receptive regions accept ink and repel water. The ink is transferred to the surface of a medium upon which the image is to be reproduced. Typically, the ink is first transferred to an intermediate blanket, which in turn transfers the ink to the surface of the medium upon which the image is to be reproduced.

Imageable elements useful as precursors for lithographic printing plates typically comprise an imageable layer applied over the hydrophilic surface of a substrate. The imageable layer includes one or more radiation-sensitive components, often dispersed in a suitable binder. Following imagewise exposure, either the exposed regions or the unexposed regions of the imageable layer are removed by a suitable developer, revealing the underlying hydrophilic surface of the substrate. If the exposed regions are removed, the precursor is positive-working. Conversely, if the unexposed regions are removed, the precursor is negative-working. In each instance, the regions of the imageable layer (i.e., the image areas) that remain are ink-receptive, and the regions of the hydrophilic surface revealed by the developing process accept water and aqueous solutions, typically a fountain solution, and do not accept ink.

Conventional imaging of the imageable element with ultraviolet and/or visible imaging radiation can be carried out through a mask having transparent and opaque regions. The mask is placed in direct contact with the imageable element, and ultraviolet imaging radiation is directed through the mask. The regions of the imageable element under the transparent regions of the mask are exposed, while the regions under the opaque regions of the mask are unexposed.

However, direct digital imaging, which obviates the need for imaging through a mask, is becoming increasingly prevalent in the printing industry. In particular, imageable elements for the preparation of lithographic printing plates have been developed for imaging with infrared lasers. High-performance lasers or laser diodes which are used in commercially available image-setters generally emit light in the wavelength ranges of between 800 to 850 nm or between 1060 and 1120 nm. Such a laser beam can be digitally controlled via a computer; i.e. the laser can be turned on or off so that an imagewise exposure of the precursor can be effected via stored digitized information in the computer.

Therefore, printing plate precursors, or initiator systems contained therein, which are to be imagewise exposed by means of such image-setters need to be sensitive in the near-infrared region of the spectrum. Such printing plate precursors can then be handled under daylight conditions which significantly facilitates their production and processing.

Imaged elements typically require processing in a chemical developer to convert them to lithographic printing plates. Developers are typically alkaline solutions, which may also contain substantial amounts of organic solvents. Because of high pH and the presence of organic solvents, disposal of substantial quantities of used developer is expensive and can cause environmental problems. Processing of the imaged element in a chemical developer also introduces additional costs in the cost of the developer, the cost of the processing equipment, and the labor costs for operating the process.

It is desirable to reduce or eliminate the cost of purchasing, handling, and disposing of chemical developers. Chemical development can be eliminated by making a printing plate precursor that is on-press developable, or a precursor that can be developed using water, for example.

On-press developable lithographic printing plate precursors can be directly mounted on a press after imaging, and are developed through contact with ink and/or fountain solution during the initial press operation. Such precursors do not require a separate development step before mounting on press. On-press imaging, in which the precursor is both imaged and developed on press, eliminates the need to mount the precursor in a separate imaging device.

Lithographic printing plate precursors that are developable in water are known. However, appropriate imageable layers for water-developable printing plate precursors are difficult to formulate, and a need remains for a precursor that is readily developable but provides acceptable press performance.

SUMMARY OF THE INVENTION

The present invention relates to a negative-working imageable element including a photosensitive coating comprising a polymeric binder having pendant groups including a poly (alkylene oxide) segment. After exposure, the imaged element can be developed conventionally off-press using water or an aqueous developer solution, or can be mounted directly on press without an intermediate development step.

In one embodiment, the present invention provides an imageable element including a lithographic substrate and an imageable layer disposed on the substrate. The imageable layer includes a radically polymerizable component, an initiator system capable of generating radicals sufficient to initiate a polymerization reaction upon exposure to imaging radiation, and a polymeric binder having a hydrophobic backbone and including constitutional units having a pendant group including a hydrophilic poly(alkylene oxide) segment. The binder may be present in the imageable layer in the form of discrete particles.

DETAILED DESCRIPTION OF THE INVENTION

Unless the context indicates otherwise, in the specification and claims, the terms photothermal conversion material, copolymer, co-binder, monomer and co-monomer, macromer, and similar terms also include mixtures and combinations of such materials. Unless otherwise specified, all percentages are percentages by weight. Unless explicitly stated otherwise, a range stated in the form "about X to Y" is intended to encompass the full range from X to Y, inclusive, and any equivalents to the stated range.

For clarification of definitions for any terms relating to polymers, please refer to "Glossary of Basic Terms in Polymer Science" as published by the International Union of Pure and Applied Chemistry ("IUPAC"), *Pure Appl. Chem.* 68, 2287-2311 (1996). However, any definitions explicitly set forth herein should be regarded as controlling.

On-press imageable elements are known in the art. For example, U.S. Pat. No. 6,582,882 to Pappas, et al. (the disclosure of which is incorporated herein by reference in its entirety) reports a thermally imageable composition comprising a copolymer having polyethylene oxide side chains. This reference does not, however, report a composition comprising polymerizable components or initiators.

Co-pending U.S. patent application Ser. No. 10/066,874 (U.S. publication application 2003/0157433) of Timpe, et al. (the disclosure of which is incorporated herein by reference in its entirety) reports an infrared-sensitive composition comprising a first polymeric binder which does not comprise acidic groups, a second polymeric binder comprising polyether groups, an initiator system, and a free radical polymerizable system. The second binder can be a polyalkylene ether polymer or copolymer, such as a block copolymer of polyethylene oxide and polypropylene oxide.

Co-pending U.S. patent application Ser. No. 10/119,454 (U.S. publication application 2003/0064318) of Huang, et al. reports a polymerizable coating composition comprising a polymerizable compound and a polymeric binder comprising polyethylene oxide segments. The binder can be a block copolymer having a polyethylene oxide block, or a graft copolymer having polyethylene oxide side chains.

The present invention provides a novel imageable element including a lithographic substrate and an imageable layer disposed on the substrate. The imageable layer includes a radically polymerizable component, an initiator system capable of generating radicals sufficient to initiate a polymerization reaction upon exposure to imaging radiation, and a polymeric binder having a hydrophobic backbone and including constitutional units having a pendant group including a hydrophilic poly(alkylene oxide) segment. The polymeric binder may further comprise constitutional units having a pendant cyano group attached directly to the hydrophobic backbone in some embodiments.

Imageable Element

The imageable element includes an imageable layer disposed on a lithographic substrate. The imageable element is negative-working. The imageable layer includes a polymerizable component, an initiator system, and a polymeric binder. The lithographic substrate and imageable layer are described further below.

In some embodiments, no layers other than the imageable layer are utilized in the imageable element. However, in other embodiments the imageable element may further include an overlying layer. The overlying layer in part serves as an oxygen barrier layer that prevents the diffusion of oxygen from the atmosphere into the imageable layer. The overlying layer should be soluble, dispersible in, or at least swellable by or permeable to the aqueous developer. The overlying layer also may prevent damage, such as scratching, of the surface layer during handling prior to imagewise exposure; prevent damage to the surface of the imagewise exposed areas, for example, by over-exposure which could result in partial ablation; or facilitate developability of the unexposed areas.

In some embodiments, the imageable element can include a layer underlying the imageable layer. The underlying layer, in part, enhances developability of the imagewise unexposed areas and acts as a thermal insulating layer for the imagewise exposed areas. A thermal insulating polymeric layer prevents otherwise rapid heat dissipation, for example, through a heat-conducting substrate. In accordance with these functions, the underlying layer should be soluble or at least dispersible in the aqueous developer and, preferably, have relatively low thermal conductivity.

Lithographic Substrate

The lithographic substrate acts as a support, and may be any material conventionally used for the preparation of lithographic printing plates. In general, a suitable lithographic substrate will have a hydrophilic surface on which the imageable layer is disposed.

The substrate material should be strong, stable, and flexible. It should resist dimensional change under conditions of use so that color records will register in a full-color image. Typically, it can be any self-supporting material, including, for example, polymeric films such as polyethylene terephthalate film, ceramics, metals, or stiff papers, or a lamination of any of these materials. Suitable metal materials include, for example, aluminum, zinc, titanium, and alloys thereof. The back side of the lithographic substrate (i.e., the side opposite the imageable layer) may be coated with an antistatic agent and/or a slipping layer or matte layer to improve handling and "feel" of the imageable element.

Typically, when the substrate material is a polymeric film, it will contain a sub-coating on one or both surfaces to modify the surface characteristics. For example, the polymeric film may be coated to enhance the hydrophilicity of the surface, to improve adhesion to overlying layers, to improve planarity of paper substrates, and the like. The nature of this coating depends upon the substrate and the composition of subsequent layers. Examples of subbing materials are adhesion-promoting materials, such as alkoxysilanes, aminopropyltriethoxysilane, glycidoxypropyltriethoxysilane and epoxy functional polymers, as well as conventional subbing materials used on polyester bases in photographic films.

One particularly suitable lithographic substrate is a hydrophilic aluminum substrate. Generally an aluminum support will be surface-treated by techniques known in the art, including physical graining, electrochemical graining, chemical graining, and anodizing. If the surface is roughened, the average roughness (Ra) is preferably in the range from 0.1 to 0.8 μm, and more preferably in the range from about 0.1 to 0.4 μm.

Conventional anodization techniques include sulfuric acid anodization and phosphoric acid anodization, for example. Anodic pore size for sulfuric acid anodization is typically less than 20 nm whereas anodic pore size for phosphoric acid anodization is typically greater than 30 nm. The use of large anodic pore substrates that are phosphoric acid anodized is preferred over sulfuric acid-anodized substrates. Other conventional anodization methods can also be used in the preparation of the anodized substrate of the present invention, including particularly those that produce an anodic pore size larger than anodic pore size produced by sulfuric acid anodization.

The substrate should be of sufficient thickness to sustain wear from printing and be thin enough to wrap around a cylinder in a printing press, typically about 100 μm to 600 μm. An aluminum lithographic substrate may comprise an interlayer between the aluminum support and any overlying layers. The interlayer may be formed by treatment of the aluminum support with, for example, silicate, dextrine, hexafluorosilicic acid, phosphate/fluoride, poly(acrylic acid) (PAA), poly(vinyl phosphonic acid) (PVPA), vinyl phosphonic acid co-polymers, or a water-soluble diazo resin.

Imageable Layer

The imageable layer comprises a polymerizable composition including a polymerizable component, an initiator system, and a polymeric binder. The polymerizable composition generally comprises at least 35 wt.-%, more suitably about 35 wt.-% to 60 wt.-%, and most suitably about 40 wt.-% to 50 wt.-% of the polymerizable component. The polymerizable composition also generally includes about 10 wt.-% to 65 wt.-%, more suitably about 20 wt.-% to 50 wt.-%, and most suitably about 30 wt.-% to 40 wt.-% of polymeric binder. The polymerizable composition generally includes about 0.01 wt.-% to 20 wt.-%, more suitably about 0.1 wt.-% to 10 wt.-%, of the initiator system.

Other conventional ingredients, such as surfactants and contrast dyes, may be included in the polymerizable composition. The polymerizable composition may optionally include up to 20 wt.-%, more suitably about 0 wt.-% to 5 wt.-%, of other ingredients.

By way of example, an additive for extending shelf life of the imageable layer may be included as an optional ingredient. Examples of additives that may be effective for extending shelf life include mercapto compounds, amino compounds, and monocarboxylic or polycarboxylic acids. Suitable mercapto compounds are described in co-pending U.S. patent application Ser. No. 10/131,866 (U.S. publication application 2002/0197564) of Timpe, et al. (the disclosure of which is incorporated herein by reference in its entirety), for example. U.S. Pat. No. 6,309,792 to Hauck, et al. describes suitable polycarboxylic acids that have an aromatic moiety substituted with a heteroatom. U.S. patent application Ser. No. 10/283,757 (U.S. publication application 2004/0091811) of Munnelly, et al. and U.S. patent application Ser. No. 10/847,708 of Munnelly, et al. describe suitable monocarboxylic acid additives.

A contrast dye may optionally be included in the imageable layer. A contrast dye functions to enhance contrast between image areas and non-image areas of an imaged element. The presence of a contrast dye can facilitate visual inspection of the imaged element. A contrast dye is generally characterized by significant absorption in the visible region, and is generally inert in relation to the other components of the imageable layer. Furthermore, the contrast dye should not absorb significantly at the wavelength of the imaging radiation.

By way of example only, the contrast dye can be a triarylmethane dye, diphenylnaphthylmethane dye (such as Victoria Blue B, Victoria Blue 4R), quinoline dye (such as quinaldine red), styryl dye, xanthene dye (such as rhodamine dye rhodamine B, or a fluorone dye such as eosin B), or a thiazine dye (such as methylene blue), or a combination thereof. In particular, triarylmethane dyes or diphenylnaphthylmethane dyes (or a combination thereof) may be suitable as a contrast dye, including methyl violet, ethyl violet, crystal violet, malachite green, brilliant green, Victoria blue B, Victoria blue R, and Victoria pure blue BO, or a dye of the following structure:

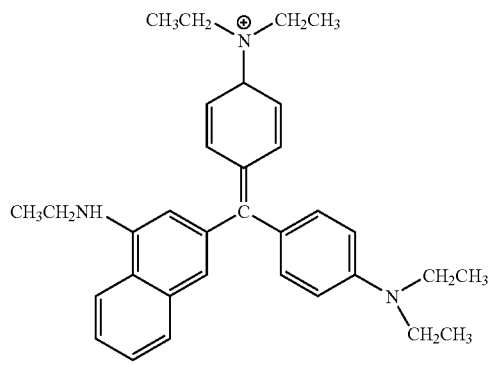

-continued

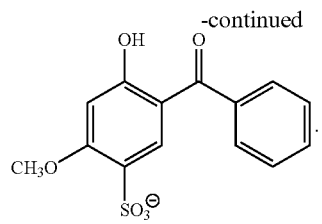

The polymerizable composition may optionally include about 0.1 to 15 wt.-%, more suitably from about 0.5 to 5 wt.-%, of a contrast dye or mixture of contrast dyes.

To attain an imageable layer that is developable using water or a mild aqueous developer solution, the dry coating weight of the imageable layer will generally be greater than about 0.2 $g/m^2$ and less than 1.5 $g/m^2$, and typically in the range from about 0.6 $g/m^2$ to 1.2 $g/m^2$. A coating weight of 1.0 $g/m^2$ may be particularly suitable, for example.

Polymerizable Component

The imageable layer comprises a polymerizable or crosslinkable component. The polymerization or crosslinking of the polymerizable or crosslinkable component may be radically initiated, for example.

The polymerizable or crosslinkable component includes at least one ethylenically unsaturated compound that undergoes free radical-initiated polymerization or crosslinking. The ethylenically unsaturated compound can be a polymerizable monomer, for instance. Suitable monomers are typically multifunctional, i.e., they comprise more than one ethylenically unsaturated, free radical polymerizable group. Typical multifunctional monomers are unsaturated esters of alcohols, preferably acrylate and methacrylate esters of polyols. Oligomers and/or prepolymers, such as urethane acrylates and methacrylates, epoxide acrylates and methacrylates, polyester acrylates and methacrylates, polyether acrylates and methacrylates and unsaturated polyester resins, may also be used.

Numerous other unsaturated monomers polymerizable by free-radical initiated polymerization and useful in polymerizable compositions are known to those skilled in the art and are described, for example, in *Photoreactive Polymers: The Science and Technology of Resists*, A. Reiser, Wiley, New York, pp. 102-177 (1989); in "Photopolymers: Radiation Curable Imaging Systems," by B. M. Monroe, in *Radiation Curing: Science and Technology*, S. P. Pappas, Ed., Plenum, New York, pp. 399-440 (1992); and "Polymer Imaging" by A. B. Cohen and P. Walker, in *Imaging Processes and Material*, J. M. Sturge, et al., Eds., Van Nostrand Reinhold, New York, pp. 226-262 (1989).

The polymerizable component of the invention is present in sufficient amount to render imaged areas insoluble in an aqueous developer after exposure to heat or radiation. The weight ratio of polymerizable component to binder ranges from about 35:65 to 60:40; more suitably from about 40:60 to 55:45; and in some embodiments may be about 50:50.

Initiator System

The polymerizable composition includes an initiator system for initiating a polymerization reaction upon imagewise exposure of the imageable element. Upon exposure to heat or radiation, the initiator system generates free radicals to initiate the polymerization reaction. The initiator system may be responsive, for example, to electromagnetic radiation in the ultraviolet, visible and/or infrared spectral regions, corresponding to the spectral range of about 300 to 1400 nm.

Suitable initiator systems will be recognized by those skilled in the art. In some embodiments, the initiator system comprises a compound (or compounds) that generates free radicals when the imageable element is thermally imaged. Thermally sensitive free radical generators include, for example, peroxides such as benzoyl peroxide; hydroperoxides such as cumyl hydroperoxide; azo compounds such as azo bis-isobutyronitrile; 2,4,5-triarylimidazolyl dimers (hexaarylbisimidazoles) such as are disclosed in Dueber, et al., U.S. Pat. No. 4,565,769; trihalomethyl triazines; borate salts; and onium salts, for example, diazonium salts, iodonium salts, sulfonium salts, phosphonium salts, and pyridinium salts; and mixtures thereof. Diaryliodonium salts and triarylsulfonium salts are especially suitable onium salts. The polymerizable composition typically comprises about 0.5 to 7 wt.-% of a radical-generating compound.

In some embodiments, the initiator system is sensitive to infrared radiation. The infrared radiation may be in the range from about 700 to 1200 nm, for example. An imageable layer that is to be imaged with infrared radiation typically comprises an infrared absorber, known as a "photothermal conversion material." Photothermal conversion materials absorb radiation and convert it to heat. Although a photothermal conversion material is not necessary for imaging with a hot body, imageable elements that contain a photothermal conversion material may also be imaged with a hot body, such as a thermal head or an array of thermal heads.

The photothermal conversion material may be any material that can absorb radiation and convert it to heat. Suitable materials include dyes and pigments. Suitable pigments include, for example, carbon black, Heliogen Green, Nigrosine Base, iron (III) oxide, manganese oxide, Prussian Blue, and Paris blue. The size of the pigment particles should not be more than the thickness of the layer that contains the pigment. Most suitably, the size of the particles will be half the thickness of the layer or less. The amount of photothermal conversion material present in the imageable layer is generally sufficient to provide an optical density of at least 0.05, and preferably, an optical density of from about 0.5 to at least about 2 to 3 at the imaging wavelength. The polymerizable composition typically comprises about 0.5 to 10 wt.-% of a photothermal conversion material.

The photothermal conversion material may include a dye with the appropriate absorption spectrum and solubility. Dyes, especially dyes with a high extinction coefficient in the range of 750 nm to 1200 nm, are preferred. Examples of suitable dyes include dyes of the following classes: methine, polymethine, arylmethine, cyanine, hemicyanine, streptocyanine, squarylium, pyrylium, oxonol, naphthoquinone, anthraquinone, porphyrin, azo, croconium, triarylamine, thiazolium, indolium, oxazolium, indocyanine, indotricarbocyanine, oxatricarbocyanine, phthalocyanine, thiocyanine, thiatricarbocyanine, merocyanine, cryptocyanine, naphthalocyanine, polyaniline, polypyrrole, polythiophene, chalcogenopyryloarylidene and bis(chalcogenopyrylo)polymethine, oxyindolizine, pyrazoline azo, and oxazine classes. Infrared-absorbing dyes are disclosed in numerous publications, for example, European Pat. App. 0 823 327 of Nagasaka, et al., U.S. Pat. No. 4,973,572 to DeBoer, and U.S. Pat. No. 5,208,135 to Patel, et al. Other examples of useful infrared-absorbing dyes include ADS-830A and ADS-1064 available from American Dye Source, Inc. (Baie D'Urfe, Quebec, Canada).

For imageable elements that are to be developed by contact with ink and/or fountain solution, water-soluble photothermal conversion materials may be suitable. Water-soluble photothermal conversion materials include, for example, cyanine dyes which one or more sulfate and/or sulfonate groups. Infrared-absorbing cyanine anions that contain two to four sulfonate groups are reported, for example, in U.S. Pat. No. 5,107,063 to West, et al., U.S. Pat. No. 5,972,838 to Pearce, et al., U.S. Pat. No. 6,187,502 to Chapman, et al., and U.S. Pat. No. 5,330,884 to Fabricius, et al.

In other embodiments, the initiator system includes an ultraviolet, visible or infrared absorber as a photosensitizer, and an electron acceptor capable of producing free radicals. The initiator system may also include a coinitiator capable of donating an electron and/or hydrogen atom and/or of forming a free radical. Examples of such initiator systems include: trihalomethyl triazines alone or together with a separate photosensitizer, for example, as described in U.S. Pat. No. 4,997,745 to Kawamura, et al.; spectral sensitizers for visible light activation, together with trihalomethyl triazines, as described, for example in U.S. Pat. No. 5,599,650 to Bi, et al.; 3-ketocoumarins, for ultraviolet and visible light activation, together with a polycarboxylic acid coinitiator, such as anilino-N,N-diacetic acid, and a secondary coinitiator, such as diaryliodonium salts, titanocenes, haloalkyl triazines, hexaaryl bisimidizoles, borate salts and photooxidants containing a heterocyclic nitrogen atom that is substituted by an alkoxy or acyloxy group, as described in U.S. Pat. No. 5,942,372 to West, et al.; a cyanine dye, diaryliodonium salt and a coinitiator having a carboxylic acid group bonded via a methylene group to a N, O or S group, which is directly attached to an aromatic ring, as described in U.S. Pat. No. 5,368,990 to Kawabata, et al.; a cyanine dye, for infrared radiation activation, together with a trihalomethyl triazine and an organoboron salt, as described in U.S. Pat. No. 5,496,903 to Watanabe, et al.; an infrared radiation absorber, a compound capable of producing an initiating free radical, including trichloromethyl triazines and azinium compounds and a polycarboxylic acid coinitiator having a carboxylic acid group bonded via a methylene group to a N, O, or S group, which is directly attached to an aromatic ring, as described in U.S. Pat. No. 6,309,792 to Hauck, et al.

Binder

The polymerizable composition of the imageable layer also comprises a polymeric binder having a hydrophobic backbone, and pendant groups including a hydrophilic poly (alkylene oxide) segment. The polymeric binder in some embodiments also includes pendant cyano groups attached to the hydrophobic backbone. A combination of such binders may also be employed. In some embodiments, the imageable layer includes a combination of binders, which may include an optional "co-binder" (described below) not meeting the foregoing description.

The polymerizable composition includes about 10 wt.-% to 65 wt.-%, more suitably about 20 wt.-% to 50 wt.-%, and most suitably about 30 wt.-% to 40 wt.-% of total binder (i.e., total quantity of binder and co-binders). The total binder is generally present in sufficient amount to render the photopolymerizable composition soluble or dispersible in water or an aqueous developer. From 0 wt.-% to 50 wt.-%, more suitably from about 1 wt.-% to 30 wt.-% of the polymerizable composition, may be the co-binder(s).

The polymeric binder is generally a solid at room temperature, and is typically a non-elastomeric thermoplastic. The polymeric binder comprises both hydrophilic and hydrophobic regions. Although not bound by any theory, the combination of hydrophobic and hydrophilic regions is thought to be important for enhancing differentiation of the exposed and unexposed areas, to facilitate developability.

Generally the polymeric binder is characterized by a number average molecular weight ($M_n$) in the range from about 10,000 Da to 250,000 Da, more commonly in the range from about 25,000 Da to 200,000 Da. The polymerizable composition may comprise discrete particles of the polymeric binder. Preferably, the discrete particles are particles of the polymeric binder which are suspended in the polymerizable composition. The average diameter of the particles in the suspension may be in the range from about 0.01 micron to 1 micron, more suitably in the range from about 100 nm to 700 nm. In some embodiments, the average diameter of the particles in the suspension is in the range from about 150 nm to 250 run. The presence of discrete particles tends to promote developability of the unexposed areas.

The polymeric binder may be an addition polymer or a condensation polymer. Addition polymers may be prepared from acrylate and methacrylate esters, acrylic and methacrylic acid, methyl methacrylate, allyl acrylate and methacrylate, acrylamides and methacrylamides, acrylonitrile and methacrylonitrile, styrene, hydroxystyrene or a combination thereof, for example. Suitable condensation polymers include polyurethanes, epoxy resins, polyesters, polyamides and phenolic polymers, including phenol/formaldehyde and pyrogallol/acetone polymers.

The polymeric binder includes a hydrophobic backbone (or main chain), including constitutional units having attached pendant groups. In some embodiments, the hydrophobic backbone is an all-carbon backbone, such as where the polymeric binder is a copolymer derived from a combination of ethylenically unsaturated monomers. In other embodiments, the hydrophobic backbone may include heteroatoms, such as where the polymeric binder is formed by a condensation reaction or some other means.

The polymeric binder includes a plurality of constitutional units having pendant groups including a hydrophilic poly(alkylene oxide) segment. Suitable binders are described in U.S. patent application Ser. No. 10/119,454 and U.S. Pat. No. 6,582,882 (both of which are incorporated herein by reference in their entirety), for example. The poly(alkylene oxide) segment can be an oligomer or polymer containing a block of alkylene oxide constitutional units, for example. Generally, the pendant group will be predominantly the poly(alkylene oxide) segment (or more than one such segment), but may also comprise connecting groups and terminal groups.

In some embodiments, the alkylene oxide constitutional units are ($C_1$-$C_6$) alkylene oxide groups, more typically ($C_1$-$C_3$) alkylene oxide groups. For example, the poly(alkylene oxide) segment can comprise straight or branched alkylene oxide groups comprising 1 to 3 carbons, including —[$CH_2O$]—, —[$CH_2CH_2O$]—, —[$CH(CH_3)O$]—, —[$CH_2CH_2CH_2O$]—, —[$CH(CH_3)CH_2O$]—, —[$CH_2CH(CH_3)O$]—, or substituted versions of any of the foregoing. In some embodiments, the poly(alkylene oxide) segment consists of such constitutional units. In one embodiment, the poly(alkylene oxide) segment consists of —[$CH_2CH_2O$]— constitutional units.

The poly(alkylene oxide) segments typically comprise a total of about 5 to 150 alkylene oxide constitutional units. Generally the number average molecular weight (Mn) of the poly(alkylene oxide) segments ranges from about 300 to 10,000 Da, more suitably from about 500 Da to 5,000 Da, and typically from about 1000 Da to 3,000 Da.

One example of a suitable pendant group including a poly(alkylene oxide) segment is a pendant group of the form:

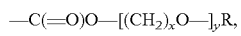

where x is 1 to 3, y is in the range from about 5 to 150, and where R is a suitable terminal group. Suitable terminal groups R may include, as non-limiting examples, alkyl groups of one to six carbon atoms, such as methyl, ethyl, n-propyl, iso-propyl, n-butyl, sec-butyl, iso-butyl, t-butyl, n-pentyl, iso-pentyl, neo-pentyl, n-hexyl, iso-hexyl, 1,1-dimethyl-butyl, 2,2-dimethyl-butyl, cyclopentyl, and cyclohexyl.

A particular example of a suitable pendant group including a poly(alkylene oxide) segment is a pendant group of the form:

where y is in the range from about 10 to 100, and more suitably y is in the range from about 25 to 75. In one embodiment, y is in the range from about 40 to 50.

In some embodiments, the polymeric binder includes a plurality of constitutional units having pendant cyano groups (—C≡N) attached directly to the hydrophobic backbone. Suitable binders are described, for example, in U.S. patent application Ser. No. 10/872,209 (incorporated by reference herein in its entirety). By way of example only, constitutional units having pendant cyano groups include —[$CH_2CH$(C≡N)]— and —[$CH_2C(CH_3)$(C≡N)]—.

Constitutional units having pendant cyano groups can derive from ethylenically unsaturated monomers such as acrylonitrile or methacrylonitrile, for example, or from a combination thereof. As used herein, the term "(meth)acrylonitrile" indicates that either acrylonitrile or methacrylonitrile, or a combination of acrylonitrile and methacrylonitrile, is suitable for the stated purpose.

In some embodiments of the invention, the polymeric binder is a copolymer derived from (meth)acrylonitrile as one co-monomer. However, constitutional units having pendant cyano groups can also be introduced into the polymer by other conventional means. By way of example, the polymeric binder may be a copolymer derived from a cyanoacrylate monomer, such as methyl cyanoacrylate or ethyl cyanoacrylate. In an alternative embodiment, the polymeric binder may be derived from a combination of (meth)acrylonitrile and a cyanoacrylate monomer.

In a particular embodiment of the invention, the main chain of the polymeric binder of the invention also comprises constitutional units derived from other suitable polymerizable monomers or oligomers. For example, the polymeric binder may comprise constitutional units derived from acrylate esters, methacrylate esters, styrene, hydroxystyrene, acrylic acid, methacrylic acid, methacrylamide, or a combination of any of the foregoing. Especially suitable are constitutional units derived from styrene or methacrylamide. Also suitable are constitutional units derived from methyl methacrylate or allyl methacrylate. In particular, constitutional units having pendant unsubstituted or substituted phenyl groups attached directly to the hydrophobic backbone may be useful. Substituted phenyl groups include, for example, 4-methylphenyl, 3-methylphenyl, 4-methoxyphenyl, 4-cyanophenyl, 4-chlorophenyl, 4-fluorophenyl, 4-acetoxyphenyl, and 3,5-dichlorophenyl. Such constitutional units may be derived from styrene or substituted styrenic monomers, for instance.

In some embodiments, the polymeric binder includes constitutional units having pendant groups that contain siloxane functionality. Suitable polymeric binders, and the preparation thereof, are described in copending U.S. patent application Ser. No. 10/842,111 entitled "On-Press Developable Imageable Element" (incorporated by reference herein in its entirety).

In one suitable polymeric binder for the practice of the present invention, a large percentage of the total recurring units include pendant cyano groups. Generally from about 70 to 99.9 mol-%, and typically from about 75 to 95 mol-%, of the total constitutional units in this polymeric binder include pendant cyano groups attached directly to the hydrophobic backbone. This polymeric binder includes only a small fraction of constitutional units having a pendant group including a hydrophilic poly(alkylene oxide) segment. Generally from about 0.1 to 5 mol-%, and typically from about 0.5 to 2 mol-%, of the total constitutional units in this polymeric binder have a pendant group including a hydrophilic poly(alkylene oxide) segment. When included, a minor fraction of the total constitutional units of this polymeric binder are derived from other monomers (such as styrene, acrylonitrile, etc.). Generally from 0 to 30 mol-%, typically from about 2 to 20 mol-%, and more suitably from about 5 to 15 mol-%, of the total constitutional units in this polymeric binder are derived from other monomers.

In one embodiment, the polymeric binder is a random copolymer consisting essentially of: i) constitutional units having a pendant cyano group attached directly to the hydrophobic backbone; ii) constitutional units having pendant groups including a hydrophilic poly(alkylene oxide) segment; and iii) constitutional units having pendant unsubstituted or substituted phenyl groups attached directly to the hydrophobic backbone. In another embodiment, the polymeric binder is a random copolymer consisting essentially of: i) constitutional units of the form —[$CH_2C(R)(C\equiv N)$]—; ii) constitutional units of the form —[$CH_2C(R)(PEO)$]—, wherein PEO represents a pendant group of the form —$C(=O)O$—[$CH_2CH_2O$—]$_y CH_3$, wherein y is in the range from about 25 to 75; and iii) constitutional units of the form: —[$CH_2CH(Ph)$]—; wherein each R independently represents —H or —$CH_3$, and Ph represents a pendant phenyl group. In yet another embodiment, the polymeric binder is a random copolymer in which about 70 to 99.9 mol-% of the total constitutional units in the random copolymer are of the form —[$CH_2C(R)(C\equiv N)$]—; about 0.1 to 5 mol-% of the total constitutional units in the random copolymer are constitutional units of the form —[$CH_2C(R)(PEO)$]—; and about 2 to 20 mol-% of the total constitutional units in the random copolymer are of the form —[$CH_2CH(Ph)$]—.

The polymeric binder of these embodiments is typically a random copolymer obtained by a free-radical copolymerization of co-monomers. In a typical preparation, a mixture of at least two co-monomers, one that is a precursor of the constitutional units having pendant cyano groups, another that is a precursor of the constitutional units having a pendant group including the poly(alkylene oxide) segment (more properly termed a "macromer"), are co-polymerized. As used herein, the phrases "mixture of monomers" and "combination of monomers" are used for simplicity to include a mixture or combination of one or more polymerizable monomers and/or polymerizable macromers.

By way of example only, the polymeric binder of these embodiments can be formed by polymerization of a combination or mixture of suitable monomers/macromers, such as:

A) acrylonitrile, methacrylonitrile, or a combination thereof (i.e., "(meth)acrylonitrile");

B) poly(alkylene glycol)esters of acrylic acid or methacrylic acid, such as poly(ethylene glycol)methyl ether acrylate, poly(ethylene glycol)methyl ether methacrylate, or a combination thereof (i.e., "poly(ethylene glycol)methyl ether (meth)acrylate"); and C) optionally, monomers such as styrene, acrylamide, methacrylamide, etc., or a combination of suitable monomers.

Precursors useful as macromer B include, for example, polyethylene glycol monomethacrylate, polypropylene glycol methyl ether methacrylate, polyethylene glycol ethyl ether methacrylate, polyethylene glycol butyl ether methacrylate, polypropylene glycol hexyl ether methacrylate, polypropylene glycol octyl ether methacrylate, polyethylene glycol methyl ether acrylate, polyethylene glycol ethyl ether acrylate, polyethylene glycol phenyl ether acrylate, polypropylene glycol monoacrylate, polypropylene glycol monomethacrylate, polypropylene glycol methyl ether methacrylate, polypropylene glycol ethyl ether methacrylate, polypropylene glycol butyl ether methacrylate, polyethylene glycol/propylene glycol)methyl ether methacrylate, poly(vinyl alcohol)monomethacrylate, polyvinyl alcohol) monoacrylate, or a mixture thereof. Precursors commonly used as monomer B include poly(ethylene glycol)methyl ether methacrylate, poly(ethylene glycol)acrylate, poly(propylene glycol)methyl ether methacrylate, or a combination thereof. As used herein, the term "(meth)acrylate" with respect to a polymerizable macromer indicates that either an acrylate macromer or a methacrylate macromer, or a combination of acrylate macromers and methacrylate macromers, is suitable for the stated purpose. Also, the phrase "alkyl ether" with respect to a macromer indicates a lower alkyl ether, generally a ($C_1$-$C_6$) linear or branched saturated alkyl ether, such as, e.g., a methyl ether or ethyl ether.

Suitable monomers that may be used as optional monomer C include, for example, acrylic acid, methacrylic acid, acrylate esters, methacrylate esters such as methyl methacrylate, allyl methacrylate, hydroxyethyl methacrylate, styrene, hydroxystyrene, methacrylamide, or a combination of any of the foregoing. Especially suitable are styrene or methacrylamide, or monomers derived therefrom. Specific examples of suitable monomers include styrene, 3-methyl styrene, 4-methyl styrene, 4-methoxy styrene, 4-acetoxy styrene, alpha-methyl styrene, acrylic acid, methyl acrylate, ethyl acrylate, butyl acrylate, n-hexyl acrylate, methacrylic acid, methyl methacrylate, ethyl methacrylate, n-propyl methacrylate, n-butyl methacrylate, n-pentyl methacrylate, neo-pentyl methacrylate, cyclohexyl methacrylate, n-hexyl methacrylate, 2-ethoxyethyl methacrylate, 3-methoxypropyl methacrylate, allyl methacrylate, vinyl acetate, vinyl butyrate, methyl vinyl ketone, butyl vinyl ketone, vinyl fluoride, vinyl chloride, vinyl bromide, maleic anhydride, maleimide, N-phenyl maleimide, N-cyclohexyl maleimide, N-benzyl maleimide, and mixtures thereof.

By way of example, the polymeric binder described above may be prepared by free radical polymerization. Free radical polymerization is well known to those skilled in the art and is described, for example, in Chapters 20 and 21, of *Macromolecules*, Vol. 2, 2nd Ed., H. G. Elias, Plenum, New York, 1984. Useful free radical initiators are peroxides such as benzoyl peroxide, hydroperoxides such as cumyl hydroperoxide and azo compounds such as 2,2'-azobisisobutyronitrile (AIBN). Chain transfer agents, such as dodecyl mercaptan, may be used to control the molecular weight of the compound.

In one embodiment, the polymeric binder is a copolymer derived from a combination of polymerizable monomers that includes at least 50 wt.-% of monomer A.

In another embodiment, the polymeric binder is a copolymer derived from: about 55 to 90 percent (meth)acrylonitrile, by weight; about 5 to 15 percent poly(ethylene glycol)alkyl ether(meth)acrylate, by weight; and about 5 to 30 percent styrene, by weight. In yet another embodiment, the polymeric binder is a copolymer derived from a combination of monomers consisting essentially of: about 55 to 90 percent (meth)acrylonitrile, by weight; about 5 to 15 percent poly(ethylene glycol)alkyl ether(meth)acrylate, by weight; and about 5 to 30 percent styrene, by weight. In still another embodiment, the polymeric binder is a copolymer derived from a combination of monomers consisting essentially of: about 55 to 90 percent acrylonitrile, by weight; about 5 to 15 percent poly(ethylene glycol)methyl ether methacrylate, by weight; and about 5 to 30 percent styrene, by weight.

Suitable solvents for free radical polymerization include liquids that are inert to the reactants and which will not otherwise adversely affect the reaction, for example, esters such as ethyl acetate and butyl acetate; ketones such as methyl ethyl ketone, methyl isobutyl ketone, methyl propyl ketone, and acetone; alcohols such as methanol, ethanol, isopropyl alcohol, and butanol; ethers such as dioxane and tetrahydrofuran; and mixtures thereof.

However, the polymeric binder is preferably prepared in hydrophilic medium (water or mixtures of water and alcohol), which may facilitate the formation of particles dispersed in the solvent. Furthermore, it may be desirable to conduct the polymerization in a solvent system that does not completely dissolve the monomer(s) that result in constitutional units that provide hydrophobic character to the polymer backbone, such as acrylonitrile or methacrylonitrile. By way of example, the polymeric binder may be synthesized in a water/alcohol mixture, such as a mixture of water and n-propanol. Suitable synthetic methods are described in U.S. patent application Ser. No. 10/891,727 (incorporated by reference in its entirety), for instance.

All monomers/macromers and polymerization initiators may be added directly to the reaction medium, with the polymerization reaction proceeding at an appropriate temperature determined by the polymerization initiator chosen. Alternatively, the macromers containing the poly(alkylene oxide) segment may be added to a reaction solvent first, followed by the slow addition of monomers at an elevated temperature. The initiator may be added to a monomer mixture, or to a solution of macromer, or both.

Although preparation of the polymeric binder has been described in terms of monomers and macromers that can be used to form the co-polymer, practice of the invention is not limited to the use of copolymers formed by polymerization of a mixture of co-monomers. The polymeric binder may be formed by other routes that will be apparent to those skilled in the art, such as by modification of precursor polymers. In some embodiments, the polymeric binder can be prepared as a graft copolymer, such as where the poly(alkylene oxide) segment is grafted onto a suitable polymeric precursor. Such grafting can be done, for example, by anionic, cationic, non-ionic, or free radical grafting methods.

By way of example only, the polymeric binder can be prepared by first copolymerizing a suitable combination of polymerizable monomers to produce a graftable copolymer, and thereafter grafting a functional group comprising the poly(alkylene oxide) segment onto the graftable copolymer. For instance, a graft copolymer may be prepared by reacting hydroxy-functional or amine functional polyethylene glycol monoalkyl ethers with a polymer having co-reactive groups, including acid chloride, isocyanate or anhydride groups. Other methods of preparation of the graft copolymers suitable for use in the present invention include methods described in the aforementioned U.S. Pat. No. 6,582,882.

Optional Co-Binder

In addition to the binder described above, the imageable layer may optionally comprise one or more co-binders. Typical co-binders are water-soluble or water-dispersible polymers, such as, cellulose derivatives such as carboxymethyl cellulose, methylcellulose, hydroxypropyl methylcellulose, hydroxypropyl cellulose, hydroxyethyl cellulose; polyvinyl alcohol; polyacrylic acid; polymethacrylic acid; polyvinyl pyrrolidone; polylactide; polyvinyl phosphonic acid; synthetic co-polymers, such as the copolymer of an alkoxy polyethylene glycol acrylate or methacrylate, for example, methoxy polyethylene glycol acrylate or methacrylate, with a monomer such as methyl methacrylate, methyl acrylate, butyl methacrylate, butyl acrylate, or allyl methacrylate; or mixtures thereof.

In some embodiments, the co-binder provides crosslinkable sites. For example, the crosslinkable sites may be ethylenically unsaturated sites. By way of example only, suitable co-binders having unsaturated sites are described in U.S. patent application Ser. No. 10/217,005 (filed Aug. 12, 2002), which is hereby incorporated by reference in its entirety.

Preparation of an Imageable Element

The imageable elements may be prepared by applying the imageable layer over the hydrophilic surface of the lithographic substrate using conventional techniques. The imageable layer may be applied by any suitable method, such as coating or lamination.

Typically the ingredients of the imageable layer are dispersed or dissolved in a suitable coating solvent, such as water or a mixture of water and an organic solvent such as methanol, ethanol, iso-propyl alcohol, and/or acetone. A surfactant, such as a fluorinated surfactant or a polyethoxylated dimethylpolysiloxane copolymer, or a mixture of surfactants may be present to help disperse the other ingredients in the coating solvent. The resulting mixture is coated onto the lithographic substrate by conventional methods, such as spin coating, bar coating, gravure coating, die coating, slot coating, or roller coating.

After coating, the imageable layer is dried to evaporate the solvent. The imageable layer may be air dried at ambient temperature or at an elevated temperature, such as in an oven. Alternatively, the imageable layer may be dried by blowing warm air over the imageable element. To attain an imageable layer that is developable using water or a mild aqueous developer solution, the dry coating weight will generally be greater than about 0.2 g/m$^2$ and less than 1.5 g/m$^2$, and typically in the range from about 0.6 g/m$^2$ to 1.2 g/m$^2$. A coating weight that is too low will not provide adequate on-press wear properties, while a coating weight that is significantly higher than the stated range will be more difficult to develop using water or an aqueous developer. A coating weight of 1.0 g/m$^2$ may be particularly suitable, for example.

Imaging and Processing of the Imageable Elements

The invention further provides a method for making a printing plate, comprising the steps of: a) providing an imageable element as described above; b) imagewise exposing the element to imaging radiation; and c) developing the element by contacting the element with a suitable developer solution, to yield the printing plate.

The imageable element is imagewise exposed to produce exposed regions and unexposed regions of the imageable layer. Imagewise exposure initiates a polymerization reaction in exposed regions.

In some embodiments, imagewise exposure is done using infrared imaging radiation. The imageable element may, for example, be imagewise exposed using semiconductor lasers or laser diodes which emit in the near-infrared region of the electromagnetic spectrum. Such a laser beam can be digitally controlled via a computer; i.e. the laser can be turned on or off so that an imagewise exposure of the precursor can be effected via stored digitized information in the computer.

Presently, high-performance lasers or laser diodes used in commercially available image setters emit infrared radiation in the wavelength ranges of between 800 and 850 nm or between 1060 and 1120 nm. Other infrared-emitting light sources may also be suitable.

An example of an apparatus comprising a suitable radiation source for imagewise exposure is the Creo TRENDSETTER 3230 from CreoScitex (Burnaby, British Columbia), which contains a laser diode that emits near-infrared radiation at a wavelength of about 830 nm. Other apparatus comprising suitable radiation sources include the CRESCENT 42T PLATESETTER (Gerber Scientific, South Windsor, Conn.), an internal drum platesetter that operates at a wavelength of 1064 nm; and the PlateRite Model 8600 and Model 8800 available from Screen (USA) (Rolling Meadows, Ill.).

Other modes of imaging are also suitable for the practice of the present invention, provided that the necessary energy is supplied to the imageable layer to initiate the polymerization reaction. The imageable element may be thermally imaged using a hot body, for example, such as a conventional apparatus containing a thermal printing head. A suitable apparatus includes at least one thermal head but would usually include a thermal head array.

Imagewise exposure produces an imaged element, which comprises a latent image of exposed regions and complementary unexposed regions. Development of the imaged element to form a printing plate converts the latent image to an image by removing the unexposed regions, revealing the hydrophilic surface of the underlying substrate.

To effect development, the imaged element is contacted with a developer solution, most suitably an aqueous developer, or with ink and/or fountain solution. The imageable elements of the present invention include on-press developable plates as well as plates which are intended for other development processes.

Development can take place in a conventional development apparatus, for example, as will be appreciated by those skilled in the art. A spray-on processor equipped with scrubbing brushes can be employed. Development by immersion may also be suitable.

The composition of the developer solution is dependent on the nature of the graft copolymer composition. An aqueous developer solution may be particularly suitable. Numerous aqueous developer solutions are known to those skilled in the art. Common components of aqueous developers include surfactants, chelating agents, such as salts of ethylenediamine tetraacetic acid, organic solvents or alcohols such as benzyl alcohol, alcohol-replacement additives, and alkaline components, such as inorganic metasilicates, organic metasilicates, hydroxides and bicarbonates. The pH of the aqueous developer is preferably within about 5 to 14, depending on the nature of the graft copolymer composition.

In one embodiment, the developer solution consists essentially of water. In another embodiment, the developer solution consists essentially of water and an alcohol or alcohol-replacement additive, where water makes up the predominant portion of the developer solution. This developer solution may optionally include a small amount of a surfactant.

Using a heated developer solution may facilitate development in some embodiments. In some embodiments, heating the developer solution to a temperature greater than about 70° F., more typically greater than about 80° F., may be desirable. By way of example, a temperature of about 100° F. may be suitable.

In one embodiment of the method, the developer solution consists essentially of water heated to a temperature greater than about 80° F. In another embodiment, the developer solution consists essentially of water heated to a temperature of about 100° F.

Alternatively, the imaged element can be directly mounted on press after imaging and developed by contact with ink and/or fountain solution during the initial impressions. No separate development step is needed before mounting on press. This eliminates the separate development step along with both the processing equipment and developer, thus simplifying the printing process and reducing the amount of expensive equipment required and chemical waste generated. Typical ingredients of aqueous fountain solutions, in addition to water, include pH buffering systems, such as phosphate and citrate buffers; desensitizing agents, such as dextrin, gum arabic, and sodium carboxymethylcellulose; surfactants and wetting agents, such as aryl and alkyl sulfonates, polyethylene oxides, polypropylene oxides, and polyethylene oxide derivatives of alcohols and phenols; humectants, such as glycerin and sorbitol; low boiling solvents such as ethanol and 2-propanol; sequestrants, such as borax, sodium hexametaphosphate, and salts of ethylenediamine tetraacetic acid; biocides, such as isothiazolinone derivatives; and antifoaming agents.

For on-press imaging, the imageable element is imaged while mounted on a lithographic printing press cylinder, and the imaged element is developed on-press with fountain solution and/or ink during the initial press operation. This method does not comprise a separate development step. This method is especially suitable for computer-to-press applications in which the imageable element (or elements, for multiple color presses) is directly imaged on the plate cylinder according to computer-generated digital imaging information and, with minimum or no treatment, directly prints out regular printed sheets. An example of a direct imaging printing press is the SPEEDMASTER 74-DI press from Heidelberg USA, Inc. (Kennesaw, Ga.).

Once the imageable element has been imaged and developed to form a lithographic printing plate, printing can then be carried out by applying a fountain solution and then lithographic ink to the image on the surface of the plate. The fountain solution is taken up by the unimaged regions, i.e., the surface of the hydrophilic substrate revealed by the imaging and development process, and the ink is taken up by the imaged regions, i.e., the regions not removed by the development process. The ink is then transferred to a suitable receiving medium (such as cloth, paper, metal, glass or plastic) either directly or indirectly using an offset printing blanket to provide a desired impression of the image thereon.

EXAMPLES

Glossary of Chemicals Used in Synthesis of Copolymers and in Coating Formulations Ammonium persulfate: $(NH_4)_2S_2O_8$
AQUASCRUBBER 34: Plate processor available from Precision Lithograining (South Hadley, Mass.)

Basonyl Violet 610: Triarylmethane dye available from BASF (Florham Park, N.J.)

BYK 336: Modified dimethyl polysiloxane co-polymer in a 25% xylene/methoxypropyl acetate solution, available from Byk-Chemie USA Inc. (Wallingford, Conn.)

D11 Dye: Triarylmethane dye available from PCAS (Longjumeau, France) represented by the structure:

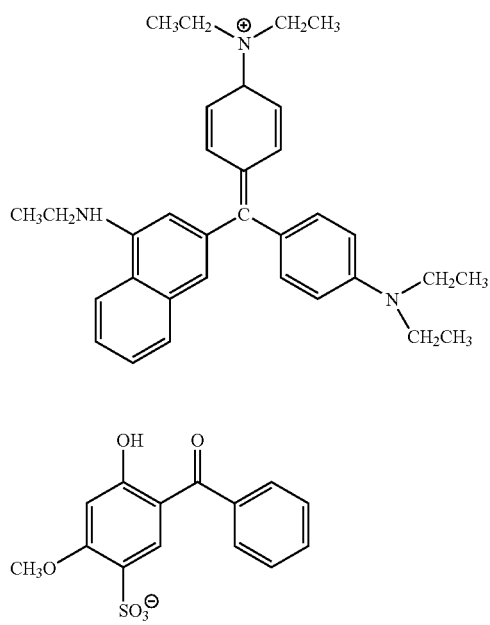

DESMODUR N100: Aliphatic polyisocyanate resin based on hexamethylene diisocyanate, available from Bayer Corp. (Milford, Conn.)

ELVACITE 4026: 10 wt.-% solution in 2-butanone of a highly-branched poly(methyl methacrylate) available from Lucite International, Inc. (Cordova, Tenn.)

Eosin B: Fluorone dye available from Aldrich Corp.

IR Dye A: IR dye represented by the structure:

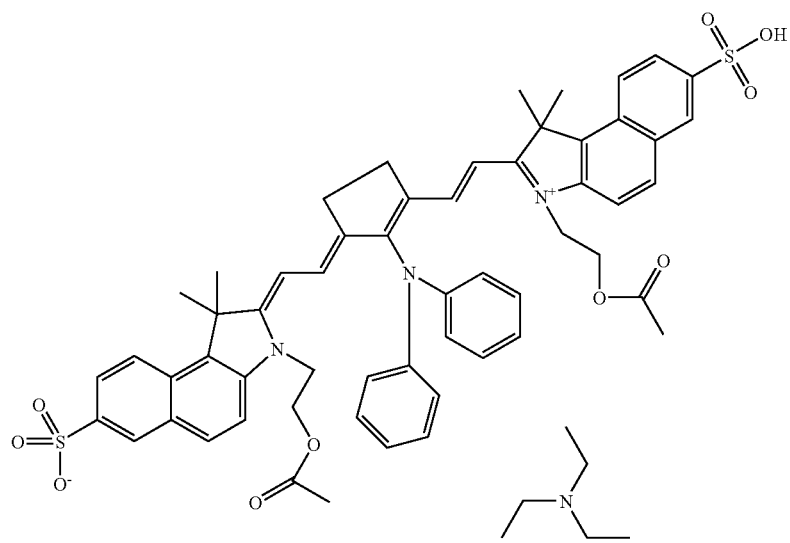

IR Dye B: IR dye represented by the structure:

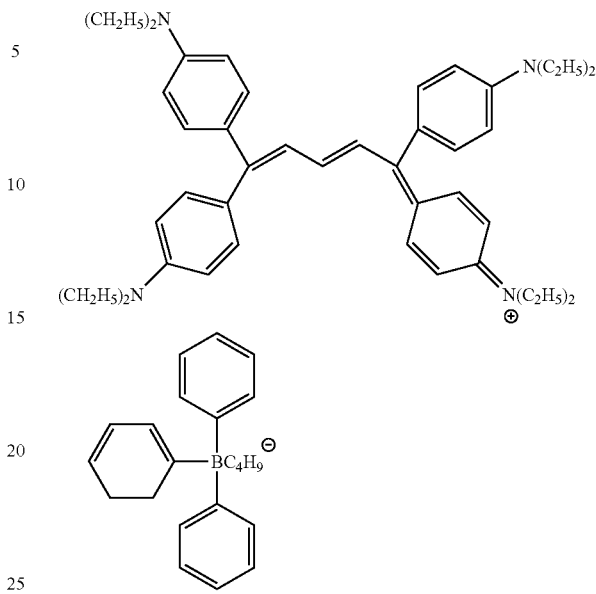

IRGACURE 250: 75 wt.-% solution of (4-methoxyphenyl)[4-(2-methylpropyl)phenyl]iodonium hexafluorophosphate in propylene carbonate, available from Ciba Specialty Chemicals (Tarrytown, N.Y.)

KLUCEL M: 2% Hydroxypropyl cellulose in water (viscosity: 5.000 mPa·s), available from Hercules Inc., Aqualon Division (Wilmington, Del.)

Mercapto-3-triazole: Mercapto-3-triazole-1H, 2, 4 available from PCAS (Paris, France)

PAA: poly(acrylic acid)

PEGMA: Poly(ethylene glycol)methyl ether methacrylate; as a 50 wt.-% solution in water, average Mn ~2080, available from Sigma-Aldrich Corp. (St. Louis, Mo.)

PVPA: poly(vinyl phosphonic acid)

Quinaldine Red: Visible dye available from Aldrich Corp.

SARTOMER 355: Ditrimethylolpropane tetraacrylate, available from Sartomer Co., Inc. (Exton, Pa.)

TRENDSETTER 3244x: Commercially available platesetter, operating at a wavelength of 830 nm, available from Creo Products (Burnaby, British Columbia)

Urethane Acrylate: 80 wt.-% solution in 2-butanone of a urethane acrylate obtained by reaction of DESMODUR N100 with hydroxyethyl acrylate and pentaerythritol triacrylate VAZO-64: 2,2'-Azobisisobutyronitrile, available from E.I. du Pont de Nemours and Co. (Wilmington, Del.)

Synthesis of Copolymers

Example 1

Synthesis of Copolymer 1

A mixture of 15 g PEGMA, 48 g water and 192 g 1-propanol was charged into a 500-mL flask, which was heated to 80° C. In a separate beaker, 66.9 g styrene and 0.48 g VAZO-64 were mixed, and part of this solution (12 g) was added to the mixture in the flask, which became hazy within about 10 minutes. Subsequently, the remaining solution was added to the flask over a 30-min period. After 3 additional hours, the resulting polymer solution contained 25 wt.-% solid of Copolymer 1.

Particle size of the polymer was measured using a MICROTRAC UPA150 ultrafine particle size analyzer available from Microtrac (North Largo, Fla.). Molecular weight was determined using gel permeation chromatography in dimethylformamide ("DMF"). Data are shown in Table 1.

In the table, "ma" is the mean diameter of the area distribution; "mv" is the mean diameter of the volume distribution, and represents the "center of gravity" of the distribution. The calculation of mv is weighted for coarse particles. The area mean ma is less weighted than mv for coarse particles, and therefore shows smaller particle size. The "50% ile" value is a median particle diameter.

$M_p$ is peak-average molecular weight; $M_n$ is number-average molecular weight; $M_w$ is weight-average molecular weight; polydispersity is defined as $M_w/M_n$.

TABLE 1

Properties of Copolymer 1.

| Binder | ma | mv | 50% ile | $M_p$ | $M_n$ | $M_w$ | Polydispersity ($M_w/M_n$) |
|---|---|---|---|---|---|---|---|
| Copolymer 1 (ACR1559) | 268 | 335 | 256 | 82,048 | 54,800 | 157,163 | 2.868 |

Example 2

Synthesis of Copolymer 2

A mixture of 54 g n-propanol and 16 g deionized water was charged into a 250-mL flask, which was heated to 70° C., purged with a steady flow of $N_2$ gas, and stirred with a mechanical stirrer. A mixture of 54 g n-propanol, 16 g deionized water, 10 g PEGMA, 6.75 g styrene, 38.25 g acrylonitrile, and 0.48 g VAZO-64 was prepared in a separate beaker and added to the 250-mL flask dropwise over a period of 30 min. About 2.5 hours later, 0.16 g VAZO-64 was added to the reaction mixture. The polymerization reaction continued for a total of 19 hours. The resulting polymer solution contained 24 wt.-% solid of Copolymer 2.

Preparation of Printing Plate Precursors and Printing Plates

Examples 3-6

Printing Plates Prepared Using Copolymer 1

Coating compositions were prepared according to the formulations shown in Table 2. For Example 3, the Contrast Dye is Basonyl Violet 610. For Example 4, the Contrast Dye is Eosin B. For Example 5, the Contrast Dye is D11. For Example 6, the Contrast Dye is Quinaldine Red.

Each coating composition was applied to a brush-grained and phosphoric acid-anodized aluminum substrate that had been post-treated with poly(acrylic acid) ("PAA"). The coating composition was applied using a wire-wound rod and then dried for approximately 60 sec in a Ranar conveyor oven set at 94° C., to yield a printing plate precursor. The dry coating weight obtained was 1.0 g/m².

TABLE 2

Formulation for coating compositions used in Examples 3-6.

| Component | Parts by Weight |
|---|---|
| Urethane Acrylate | 2.20 |
| SARTOMER 355 | 0.22 |
| Copolymer 1[1] | 7.56 |
| IRGACURE 250 | 0.28 |
| IR Dye A | 0.04 |
| Mercapto-3-triazole | 0.12 |
| Contrast Dye[2] | 0.01 |
| BYK 336 | 0.60 |
| KLUCEL M | 4.41 |
| n-Propanol | 71.13 |
| Water | 13.62 |

[1]Copolymer 1 as used in coating formulations is a dispersion of 25 wt.-% solids in an 80/20 mixture of n-propanol/water. The quantity shown in the table is the weight of the dispersion that was used, including solvent.
[2]Contrast Dye as identified in the text.

The resulting precursors for Examples 3-6 were imaged on a Creo TRENDSETTER 3244x at 250 mJ/cm². After imaging, the precursors were passed through an AQUASCRUBBER 34 processor at 2.5 ft/min. The processor was equipped with scrubbing brushes and charged with water heated to 100° F. in the developer section and 850 S Finisher Gum (available from Kodak Polychrome Graphics; Norwalk, Conn.) in the finisher section. The image areas were blue (Examples 3 and 5) and light mauve (Examples 4 and 6) in color, while the background (non-image) areas were pale-colored.

Each printing plate was mounted on an ABDick press using Van Son Rubber Base Black ink, and fountain solution containing Varn Litho Etch 142W at 3 oz./gal. and PAR alcohol replacement at 3 oz./gal. (both available from Varn International, Addison, Ill.). All plates rolled up with a clean background on the first sheet. Each printing plate printed 250 copies of excellent quality before the press was stopped.

Examples 7-10

Printing Plates Prepared Using Copolymer 2

Coating compositions were prepared according to the formulations shown in Table 3. For Example 7, the Contrast Dye is Basonyl Violet 610. For Example 8, the Contrast Dye is Eosin B. For Example 9, the Contrast Dye is D11. For Example 10, the Contrast Dye is Quinaldine Red.

Each coating composition was applied to an electrochemically-grained and sulfuric acid-anodized aluminum substrate that had been post-treated with PVPA. The coating composition was applied using a wire-wound rod and then dried for approximately 60 sec residence time in a Ranar conveyor oven set at 94° C., to yield a printing plate precursor. The dry coating weight obtained was 1.0 g/m$^2$.

TABLE 3

Formulation for coating compositions used in Examples 7-10.

| Component | Parts by Weight |
| --- | --- |
| Urethane Acrylate | 2.20 |
| SARTOMER 355 | 0.22 |
| Copolymer 2[1] | 6.82 |
| ELVACITE 4026 | 2.20 |
| IRGACURE 250 | 0.28 |
| IR Dye B | 0.04 |
| Contrast Dye[2] | 0.04 |
| Mercapto-3-triazole | 0.12 |
| BYK 336 | 0.40 |
| KLUCEL M | 4.41 |
| n-Propanol | 52.84 |
| 2-Butanone | 16.70 |
| Water | 13.72 |

[1] Copolymer 2 as used in coating formulations is a dispersion of 24 wt.-% solids in an 80/20 mixture of n-propanol/water. The quantity shown in the table is the weight of the dispersion that was used, including solvent.
[2] Contrast Dye as identified in the text.

The resulting precursors for Examples 7-10 were imaged on a Creo TRENDSETTER 3244x at 250 mJ/cm$^2$. After imaging, the precursors were passed through an AQUASCRUBBER 34 processor at 2.5 ft/min. The processor was equipped with scrubbing brushes and charged with water heated to 100° F. in the developer section and 850 S Finisher Gum in the finisher section. The image areas were blue (Examples 7 and 9) and light mauve (Examples 8 and 10) in color, while the background (non-image) areas were pale-colored.

Each printing plate was mounted on an ABDick press using Van Son Rubber Base Black ink, and fountain solution containing Varn Litho Etch 142W at 3 oz./gal. and PAR alcohol replacement at 3 oz./gal. All plates rolled up with a clean background on the first sheet, and were immediately ink-receptive. Each printing plate printed 250 copies of excellent quality before the press was stopped.

This invention may take on various modifications and alterations without departing from the spirit and scope thereof. Accordingly, it is to be understood that this invention is not to be limited to the above-described, but it is to be controlled by the following claims and any equivalents thereof. It is also to be understood that this invention may be suitably practiced in the absence of any element not specifically disclosed herein.

In describing preferred embodiments of the invention, specific terminology is used for the sake of clarity. The invention, however, is not intended to be limited to the specific terms so selected, and it is to be understood that each term so selected includes all technical equivalents that operate similarly.

What is claimed is:

1. An imageable element comprising:
a lithographic substrate; and
an imageable layer disposed on the substrate at a coating weight of less than 1.5 g/m$^2$ and including
   a) at least 35 wt.-%, based on the solids content of the imageable layer, of a radically polymerizable monomer, oligomer, or combination thereof;
   b) an initiator system capable of generating radicals sufficient to initiate a polymerization reaction upon exposure to imaging radiation; and
   c) a polymeric binder having a hydrophobic backbone and including constitutional units having a pendant group including a hydrophilic poly(alkylene oxide) segment; wherein the binder is present in the imageable layer in the form of discrete particles.

2. The imageable element of claim 1, wherein the coating weight is in the range from about 0.6 to 1.2 g/m$^2$.

3. The imageable element of claim 1, wherein the imageable layer includes between 35 wt.-% and 60 wt.-%, based on the solids content of the imageable layer, of the radically polymerizable monomer, oligomer, or combination thereof.

4. The imageable element of claim 1, wherein the initiator system is capable of generating radicals sufficient to initiate a polymerization reaction upon exposure to infrared radiation in the range from about 700 nm to 1200 nm.

5. The imageable element of claim 1, wherein the particles are characterized by an average diameter in the range from about 100 nm to 700 nm.

6. The imageable element of claim 1, wherein the particles are characterized by an average diameter in the range from about 150 nm to 250 nm.

7. The imageable element of claim 1, wherein the imageable layer further includes a contrast dye.

8. The imageable element of claim 7, wherein the contrast dye is a triarylmethane dye, diphenylnaphthylmethane dye, quinoline dye, styryl dye, xanthene dye, thiazine dye, or a combination thereof.

9. The imageable element of claim 7, wherein the contrast dye is crystal violet, methyl violet, ethyl violet, Victoria blue, malachite green, brilliant green, a dye of the following structure:

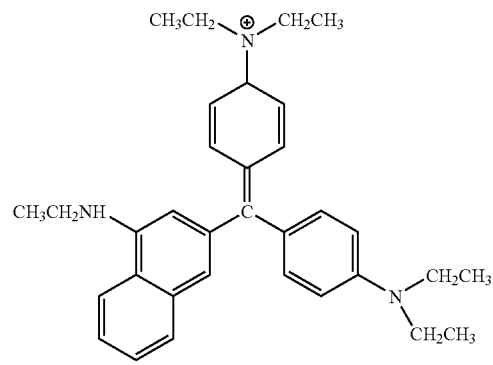

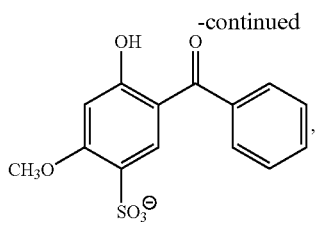

or a combination thereof.

10. A method for making a printing plate, comprising the steps of:
    providing an imageable element comprising:
        a lithographic substrate; and
        an imageable layer disposed on the substrate at a coating weight of less than 1.5 g/m² and including
            a) at least 35 wt.-%, based on the solids content of the imageable layer, of a radically polymerizable monomer, oligomer, or combination thereof;
            b) an initiator system capable of generating radicals sufficient to initiate a polymerization reaction upon exposure to imaging radiation; and
            c) a polymeric binder having a hydrophobic backbone and including constitutional units having a pendant group including a hydrophilic poly(alkylene oxide) segment; wherein the binder is present in the imageable layer in the form of discrete particles;
    imagewise exposing the imageable element to imaging radiation; and
    developing the exposed element by contacting the element with a suitable developer solution, to yield the printing plate.

11. The method of claim 10, wherein the coating weight is in the range from about 0.6 to 1.2 g/m².

12. The method of claim 10, wherein the imageable layer further includes a contrast dye.

13. The method of claim 12, wherein the contrast dye is a triarylmethane dye, diphenylnaphthylmethane dye, quinoline dye, styryl dye, xanthene dye, thiazine dye, or a combination thereof.

14. The method of claim 12, wherein the contrast dye is crystal violet, methyl violet, ethyl violet, Victoria blue, malachite green, brilliant green, a dye of the following structure:

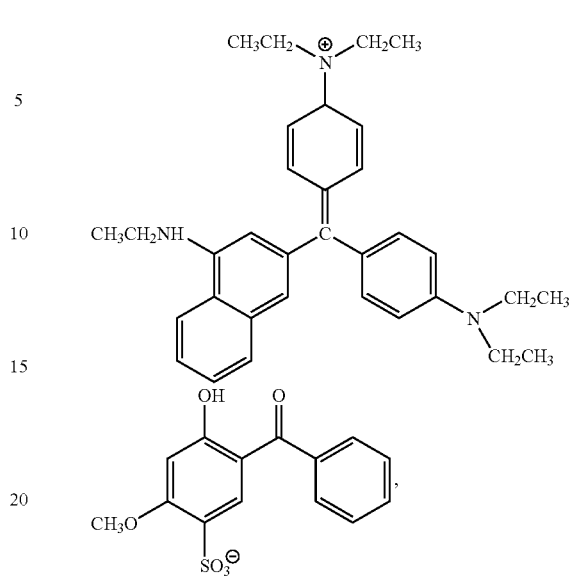

or a combination thereof.

15. The method of claim 10, wherein the developer solution is an aqueous-based solution.

16. The method of claim 10, wherein the developer solution consists essentially of water.

17. The method of claim 10, wherein the developer solution consists essentially of water and an alcohol or alcohol-replacement additive.

18. The method of claim 10, wherein the developer solution comprises a surfactant.

19. The method of claim 10, wherein the step of developing includes heating the developer solution to a temperature greater than about 80° F.

20. The method of claim 10, wherein the step of developing is done on-press, and the developer solution comprises ink, fountain solution, or a combination thereof.

* * * * *